United States Patent
Hajimiri et al.

(10) Patent No.: US 6,529,085 B2
(45) Date of Patent: Mar. 4, 2003

(54) TUNABLE, DISTRIBUTED, VOLTAGE-CONTROLLED OSCILLATOR

(75) Inventors: Seyed-Ali Hajimiri, Pasadena, CA (US); Hui Wu, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/076,945

(22) Filed: Feb. 14, 2002

(65) Prior Publication Data
US 2002/0149431 A1 Oct. 17, 2002

Related U.S. Application Data

(63) Continuation of application No. 09/548,688, filed on Apr. 13, 2000, now Pat. No. 6,396,359.
(60) Provisional application No. 60/154,664, filed on Sep. 15, 1999.

(51) Int. Cl.[7] .................................................. H03B 5/18
(52) U.S. Cl. .................... 331/96; 331/34; 331/36 C; 331/117 D; 331/177 R; 331/177 V
(58) Field of Search ............................ 331/34, 36 C, 331/46, 48, 56, 96, 99, 117 D, 177 R, 177 V

(56) References Cited

U.S. PATENT DOCUMENTS

| 2,691,099 A | 10/1954 | Lien | 250/20 |
|---|---|---|---|
| 2,735,941 A | 2/1956 | Peck | 250/36 |
| 3,516,008 A | 6/1970 | Schlosser | 331/56 |
| 3,516,021 A | 6/1970 | Kohn | 331/117 |
| 4,568,889 A | 2/1986 | Bayraktaroglu | 331/46 |
| 4,619,001 A | 10/1986 | Kane et al. | 455/192 |
| 4,670,722 A | 6/1987 | Rauscher | 331/117 |
| 5,945,847 A | * 8/1999 | Ransijn | 326/115 |

OTHER PUBLICATIONS

Ayasli, Y. et al., *A Monolithic GaAs 1–13–GHz Traveling–Wave Amplifier*, IEEE Transactions on Microwave Theory and Techniques, MTT–30(7):976–980 (Jul. 1982).

(List continued on next page.)

Primary Examiner—David C. Mis
(74) Attorney, Agent, or Firm—Christopher J. Rourk; Akin Gump Strauss Hauer & Feld, LLP

(57) ABSTRACT

Techniques and structures for tuning integrated, distributed voltage-controlled oscillators (DVCO's) across a wide microwave frequency range are disclosed. One type of DVCO implements a tuning circuit that includes a pair of interconnected amplifying transistors and a current source connected to the transistors, such that a differential voltage input to the circuit adjusts the current to each transistor and effectively adjusts the "electrical length" of one of the transmission lines on which the output frequency is oscillating. This, in turn, adjusts the time delay and thus frequency of the signal propagating on the lines across a wide frequency band. This technique is called "current-steering." In a preferred embodiment, the tuning circuit is balanced with a complementary tuning circuit to effectively adjust the electrical length of the second transmission line in the oscillator. In another technique that provides for more coarse, but wider range, broadband frequency tuning, the time delay, and thus, frequency, of the DVCO is adjustable by varying the capacitive loading on the transmission lines, by introducing a coupling capacitor between the transmission lines and tuning the intrinsic capacitances of the gain transistors with a dc bias input.

20 Claims, 8 Drawing Sheets

OTHER PUBLICATIONS

Ballweber, B. et al., *Fully–Integrated CMOS RF Amplifiers, 1999 IEEE International Solid–State Circuits Conference*, Session 4(Paper MP 4.4):72, 73, 488(Jun. 1999).

Divina, L. et al. *The Distributed Oscillator at 4 GHz, IEEE Transactions on Microwave Theory and Techniques*, 46(12):2240–2243 (Dec. 1998).

Ginzton, E.L. et al., *Distributed Amplification, Proceedings of the I.R.E.*, 956–969 (Aug. 1948).

Kleveland, B. et al., *Monolithic CMOS Distributed Amplifier and Oscillator, 1999 IEEE International Solid–State Circuits Conference*, Session 4(Paper MP 4.3):70–71 (Jun. 1999).

Skvor, Z. et al., *Novel Decade Electronically Tunable Microwave Oscillator Based on the Distributed [sic] Amplifier, Electronics Letters*, 28(17):1647–1648 (Aug. 13, 1992).

Sullivan, P.J. et al, *An Integrated CMOS Distributed Amplifier Utilizing Packaging Inductance, IEEE Transactions on Microwave Theory and Techniques*, 45(10): 1969–1975 (Oct. 1997).

Wang, H. et al., *A 9.8GH Back–Gate Tuned VCO in 0.35 μm CMOS, 1999 IEEE International Solid–State Circuits Conference*, WP 23.8 two pages (1999).

Wang, H. et al., *A 9.8GHz–Back–Gate Tuned VCO in 0.35 μm CMOS, 1999 IEEE International Solid–State Circuits Conference*, WP 23.8:two pages (1999).

Search Report for PCT/US01/46601 Dated Sep. 10, 2002 in related PCT filing of issued U.S. parent application (6,396,359) from priority provisional application No. 60/154,664.

"NMOS IC's for Clock and Data Regeneration in Gigabit–per–Second Optical–Fiber Receivers," S. Khursheed Enam, et al., *IEEE Journal of Solid–State Circuits*, pp. 1763–1774, Dec. 27, 1992.

\* cited by examiner

TUNABLE, DISTRIBUTED, VOLTAGE-CONTROLLED OSCILLATOR

This application is a Continuing Application of application Ser. No. 09/548,688, filed Apr. 13, 2000 now U.S. Pat. No. 6,396,359. This application claims the benefit of U.S. Provisional Application No. 60/154,664, entitled, "Distributed Voltage Controlled Oscillators With Novel Wideband Tuning," filed Sep. 15, 1999, which is incorporated by reference herein.

FIELD OF THE INVENTION

The present invention relates generally to the field of voltage controlled oscillators and more particularly to distributed voltage controlled oscillators (DVCO's) that are tunable over a wide band of microwave frequencies.

BACKGROUND OF THE INVENTION

Wireless broadband technology offers the prospect of mobile alternatives to high speed, wired, voice and data communication systems (e.g., fiber optic or copper wire broadband transmission systems). As with conventional radio frequency (RF) devices, an important component for up-conversion (transmission) or down-conversion (reception) in microwave broadband communication devices is the local oscillator, and particularly, the voltage-controlled oscillator (VCO), that operates in the frequency range of the carrier signal. Thus, the VCO is an essential component for up/down conversion of the transmitted signal. Typical design criteria for VCO's are frequency stability, high output level, tunablity, low phase noise, small packaging and low cost. Further, in order to increase the bandwidth of the transmitted RF signal, thereby increasing the rate of data transmission at which such wireless broadband communications systems can operate, VCO's in transmitters must be capable of generating very high, microwave carrier frequencies, that is, in the 10 gigahertz range and above. One example is the 28 GHz band of local multipoint distribution services ("LMDS") systems.

Moreover, with the increasing market demand for more powerful and smaller wireless communications systems with greater bandwidth capacity, such as wireless networked portable computers, personal digital assistants ("PDA") and other specialty communications devices, and the convergence of voice and data, there is a need for high frequency, broadband tunable VCO's that can be integrated into the microwave front-end circuits (transceivers) that are themselves integrated with digital back end circuits on a single integrated circuit ("IC") chip.

Unfortunately, existing lumped solutions for such integrated, high frequency oscillators are inadequate. For example, while it is possible to design a tunable LC resonant tank oscillator circuit on a silicon substrate at up to 10 GHz, it becomes excessively difficult to achieve a wide tuning range and good phase noise as the frequency of operation approaches the $f_{max}$, or cut off frequency, of the transistors. This is mainly due to the trade off between the self-resonance frequency and the quality factor, Q, of the integrated inductors and varactors, which is very low for operation at frequencies above the C-band (i.e. above about 6.5 GHz). This trade off becomes prohibitive as the operating frequency increases.

Thus, there exists a need for a microwave voltage-controlled oscillator ("VCO") that (1) is small, i.e. capable of being designed as part of an integrated circuit (IC) package; (2) is low cost; (3) provides stable operation; and (4) is capable of wide band tuning.

The distributed oscillator has recently been considered as a possible low-cost microwave VCO solution in CMOS radio frequency integrated circuits ("RFIC's"), due to its ability to operate at frequencies close to the intrinsic cutoff frequencies of the transistors. The distributed oscillator originates from the distributed amplifier, which has been studied for many years. For example, Skvor, et al. proposed to build a VCO by operating a distributed amplifier in the reverse gain mode, using the output from the idle drain load as the feedback output. See, "Novel Decade Electronically Tunable Microwave Oscillator based on the Distributed Amplifier," Electronics Letters, vol. 28, no. 17, pp. 1647–1648, August 1992. Further, a 4 GHz, distributed oscillator was assertedly demonstrated using discrete pHEMTs and microstrip lines on a printed circuit board (PCB). Divina L., Skvor Z., "The Distributed Oscillator at 4 GHz," IEEE Trans. MTT, vol. 46, no. 12, pp.2240–2243, December 1998. Another group recently assertedly showed an integrated (with off-chip termination and bias) distributed oscillator operating at 17 GHz without any tuning capability using 0.18 mm CMOS technology. The forward gain mode instead of reverse gain mode was used and assertedly demonstrated that CMOS is viable for oscillator applications at microwave frequencies. See Kleveland B., et aL, "Monolithic CMOS Distributed Amplifier and Oscillator," IEEE Int. Solid-State Circ. Conf., Paper MP 4.3, February 1999.

Despite these apparent advances, tuning remains a problem since distributed VCO's ("DVCO's") are used at frequencies close to the device $f_T$, where there is not enough gain to lose in tuning circuitry. Consequently, the addition of extra integrated varactors with low Q is not a favorable option due to their high loss which further deteriorates with frequency. Nor can the reverse mode tuning scheme described in the above-referenced Skvor et al. article be used due to the limited transistor gain in CMOS technologies. Therefore, a new tuning scheme must be devised.

Accordingly, it should be appreciated that there exists a definite need for a sufficiently tunable, operatively stable, and relatively low cost and integrated DVCO.

SUMMARY OF THE INVENTION

The present invention, which addresses these needs, sufficiently resides in a tunable distributed voltage control oscillator which operates at very high frequencies, is advantageously tunable across a relative very wide frequency range and is integrable on an integrated chip.

In accordance with the present invention, integrated, tunable distributed voltagecontrolled oscillators (DVCO's) and methods for tuning such oscillators over a wide microwave frequency range are disclosed. The DVCO's include two substantially parallel transmission lines, at least one three terminal active device disposed between the lines, and a tuning circuit connected to the active device that tunably controls the frequency on the lines. More particularly, the DVCO's include (1) an input transmission line with a loaded characteristic impedance having an input at one end, and an output at an opposite end that is terminated by a wave-absorbing termination that matches the loaded characteristic impedance of the input line and biased with a dc voltage; (2) an output transmission line with a loaded characteristic impedance, having an input at one end that is terminated by a wave-absorbing termination that matches the impedance of the output transmission line and biased with a dc biasing voltage, and an output at a second end that is connected to the input of the input transmission line; (3) at least one three-terminal active device with a transconductance, $g_m$, having a biasing input terminal connected to the input transmission line and an output terminal connected to the output transmission line; and (4) a tuning circuit connected to the active device that controls the time delay of the signal propagating on at least one of the transmission lines which, in turn, controls the oscillation frequency of the signal transmitting on the transmission lines. The output line preferably runs substantially in parallel with the input line.

In one detailed aspect of the invention, the tuning circuit is a current-steering circuit that operates in conjunction with the active device to controllably adjust the effective electrical length of the output transmission line. Electrically reducing the electrical length of the transmission line increases the frequency on the line and increasing the length decreases its frequency.

In another more detailed aspect of the present invention, the tuning circuit comprises an ac coupling capacitor disposed between the output of the output transmission line and input of the input transmission line. This capacitor enables the independent control of voltage on each transmission line, such that by adjusting the dc bias voltage of the input transmission line, the nonlinear capacitances and transconductances, of the at least one active device is controllably adjusted. In this way, the time delay and thus oscillation frequency of the transmission lines is adjusted. The capacitive coupling technique enables larger range but more coarse frequency tuning relative to the current steering technique described above.

The at least one active device is typically an amplifying microwave transistor, such as a CMOS or bipolar transistor. However, it can be any three terminal gain device such as an HBT vacuum tube.

In another aspect of the invention, the tunable DVCO includes an input transmission line as described above, an output transmission line as described above and an output line tuning section ("OLT") having an input connected to the input transmission line and two outputs connected to the output transmission line and separated by a transmission line segment of a given length on the output line. The OLT both amplifies the signal propagating on the output transmission line and controllably alters the electrical length of the output transmission line to adjust the frequency on the line.

The OLT includes a two three-terminal active device (such as gain transistors) and a dc current source that adjust the current between the two active devices. More particularly, the first three-terminal active device includes a control input terminal connected to the input line, an output terminal tapped to the output line, and a current input terminal. The second three-terminal active device includes a biasing input terminal connected to the input line at a tap point in common with the input terminal of the first transistor, an output terminal tapped to the output line at a point downstream from the tapping point of the output terminal of the first transistor in the direction of the output of the OTL, and a current input terminal. Importantly, the output terminals of the two transistors are spaced apart by an output transmission line segment of a given length. The dc current source controllably inversely distributes its current between the current input terminals of the two active devices, such that as the current to the two active devices is adjusted, the effective length of the output transmission line is varied, thereby controllably tuning the oscillation frequency.

In a preferred embodiment, the DVCO described in the preceding two paragraphs also includes an input line tuning section (ILT) that is completely complementary to the OLT and is connected to the input transmission line and output transmission line in parallel with the OLT. The purpose of the ILT is to balance the phase delay mismatch between the input and output lines introduced by the OLT. In particular, the complementary ILT includes a first complementary active device, a second complementary active device and a dc current source. The first complementary active device (such as a transistor) includes a control input terminal connected to the input line, an output terminal tapped to the output line, and a current input terminal. The second complementary active device has an output terminal connected to the output line at a tap point in common with the output terminal of the first complementary active device, an input terminal tapped to the input line at a point downstream from the tapping point of the input terminal of the first active device in the direction of the output of the input line and a current input terminal. The two input terminals are spaced apart by an input transmission line segment of a given length. The dc current source controllably inversely distributes its current supply between the current input terminals of the two complementary active devices, such that as the current to the two active devices is adjusted, the effective length of the input transmission line is varied, thereby controllably balancing the delay mismatch created by the OLT on the output transmission line.

As an alternative to the embodiment that describes the oscillator designed with an OLT (without a complementary delay balancing section), the oscillator may instead be designed with an ILT.

In yet a more particular aspect of the invention, the dc current source of the OLT includes a pair of active devices, each having a voltage input. These inputs together define a differential control voltage. Further, the dc current source of the ILT includes a second pair of complementary active devices each having a voltage these inputs also define a differential control voltage.

In the preferred embodiment, the DVCO includes at least one more OLT and complementary ILT connected to the input and output transmission lines. Each additional pair of OLT and ILT that is placed in the line increases the gain of the oscillator circuit.

Other features and advantages of the present invention should become more apparent from the following description of the preferred embodiments, taken in conjunction with the accompanying drawings, which illustrate, by way of example, the principles of the invention.

DETAILED DESCRIPTION OF THE PREFERRED EMBODIMENTS

The invention summarized above and defined by the enumerated claims may be better understood by referring to the following detailed description, which should be read in conjunction with the accompanying drawings. This detailed description of particular preferred embodiments, set out below to enable one to build and use particular implementations of the invention, is not intended to limit the enumerated claims, but to serve only as particular examples thereof. The particular examples set out below are the preferred specific implementations of tunable, integrated distributed, VCO's. The description also sets out below preferred implementations for laying out these circuits on an integrated chip. Prior to describing the invention, some background on the operation of integrated distributed oscillators will be illustrative.

I. Background on Distributed VCO's

Figure 1:
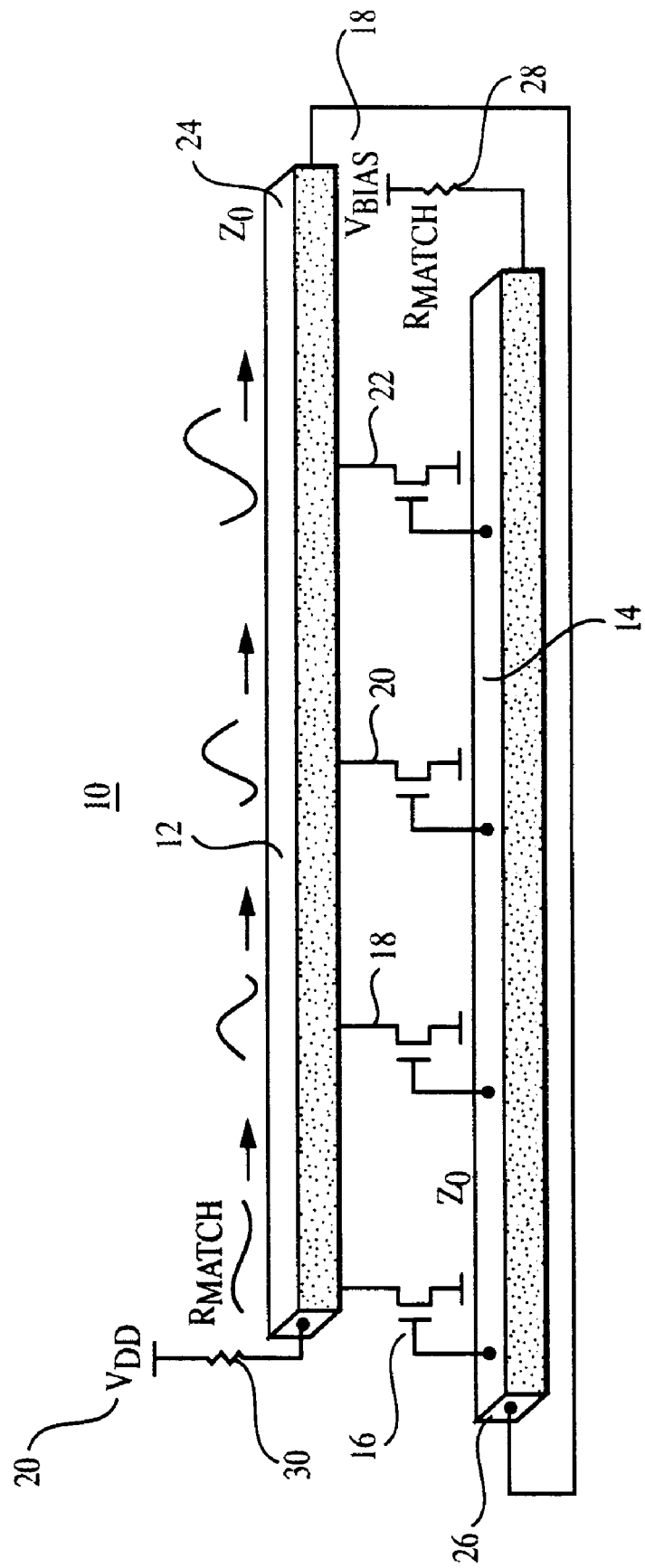
FIG. 1 is a simplified diagram of a basic distributed voltage-controlled oscillator.

Referring to FIG. 1, a non-tunable, integrated distributed oscillator 10 is shown operating in the forward-gain mode of a distributed amplifier. While the oscillator shown in this example is designed with CMOS transistors 16, 18, 20, 22, it will be understood that any three terminal active device, such as bipolar and other transistor types or vacuum tube technologies (e.g., HBT vacuum tubes) may alternatively be employed, with, of course, differing performance characteristics. Thus, for purposes of illustration, the CMOS transistor will primarily be used hereinafter as an exemplary component that represents the broad category of three-terminal active devices. The forward (to the right in the figure) wave on the gate line 14 is amplified by each transistor and appears on the drain line 12, which is biased with a dc voltage $V_{DD}$ 20. The signal on the drain line travels forward in synchronization with the traveling wave on the gate line, which is biased with dc voltage $V_{bias}$ 18, and each transistor with transconductance, $g_m$, adds power constructively to the signal at each tapping point on the drain line. Thus, the forward path of the wave can have an overall gain larger than unity, while the gain of each transistor, equal to approximately $g_m Z_o/2$, may be less than one. The output 24 of the drain line is then fed back to the input 26 of the gate line. In this example, it is assumed that both drain and gate lines have characteristic impedance $Z_o$. The forward traveling wave on the gate line and the backward (to the left in the figure) wave on the drain line are absorbed by the matched terminations, $R_{match}$ 28, 30, respectively.

To maximize the gain of each transistor, the input and output transmission line loaded characteristic impedances $Z_o$ must be maximized. High characteristic impedance can be achieved, for example, by using coplanar striplines with minimum conductor width of 3 μm for the signal line and a ground line of 8 μm. Further, a spacing between the ground and signal lines of approximately 10 μm, results in a $Z_o$ of approximately 70 ohms. Transistor loading reduces this impedance to about 40 ohms. 3.6 μm-long gate and drain lines can be modeled with SPICE modeling using a lumped lossy transmission line model with a total of 200 LRC sections.

II. Tuning Techniques and Circuits

The present invention effectively converts the prior art non-tunable VCO shown in FIG. 1 into a robust, wideband tunable VCO by introducing a controllable time delay to the microwave signal propagating on the transmission lines of the VCO. Two techniques (and circuits) for controlling this time delay and thus frequency of the signal, namely, the "current-steering" and "dc bias line" tuning techniques are now presented. It will be understood by those of skill in the art, however, that other techniques for controlling the time delay of a signal propagating on transmission lines of a distributed circuit may be implemented. It will be further understood by those of skill in the art that the present invention yields an integratable distributed voltage-controlled oscillator ("DVCO") that is tunable across a wide frequency range.

a. Current-Steering Tuning

Figure 2:
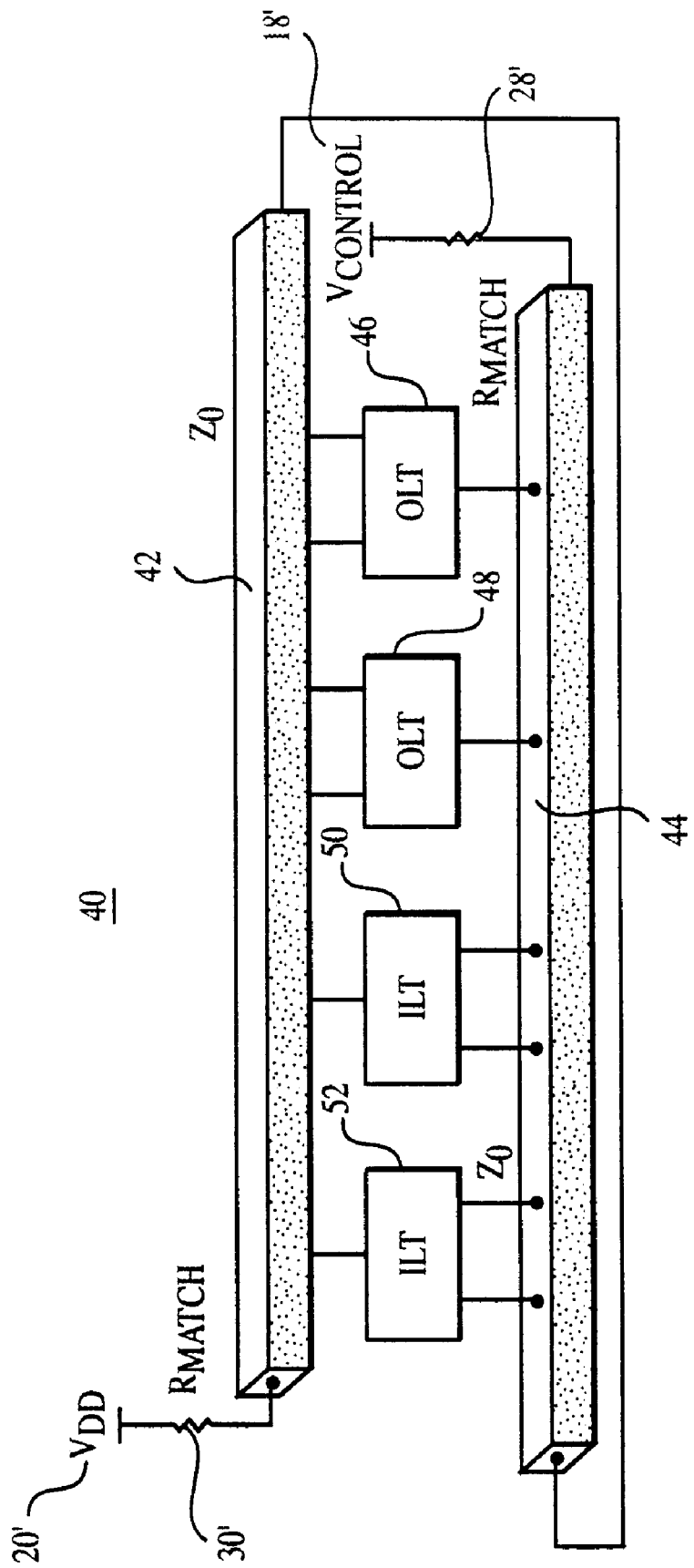
FIG. 2 is a simplified diagram of a tunable DVCO implementing the current-steering tuning technique of the present invention.

FIG. 2 illustrates the basic structure of the "current-steering" embodiment of the present inventive tunable DVCO. In particular, the DVCO 40 implements the basic architecture of the VCO shown FIG. 1, but replaces the single amplifying transistor at each stage with a voltage-controlled, amplifying and current-steering circuit (represented as boxes 46, 48, 50 and 52) that incorporates the single transistor. Thus, as in FIG. 1, this DVCO includes output and input transmission lines 42, 44, having loaded characteristic impedances $Z_0$, matched wave-absorbing terminations 28' and 30', and biasing dc voltages 18' and 20'. Preferably, the output line runs subtantially parallel to the input line. In this embodiment, the DVCO includes two output line transmission sections, "OLT's" 46 and 48, and complementary input line transmission sections, or "ILT's" 50 and 52, all disposed between output transmission line and input transmission line. As shown, each OLT has two tap points on the output transmission line 42 that are physically spaced apart by a predetermined distance. An adjustable dc voltage applied to the OLT circuitry (not shown in FIG. 1 but described in detail below) controllably alters the "electrical length" of the output line, that is, the distance the signal must travel on the output line, thereby adjusting, or tuning, the frequency of the signal on the line. Correspondingly, each complementary ILT has two tap points on the input transmission line 44 that are physically spaced apart by a distance equal to the distance between the two output line tap points of its complementary OLT. In correspondence with the function of the OLT, the electrical length of the input line bet ween the ILT tap points on the input line can be altered by the ILT circuitry (as detailed below) in order to tune the frequency on the ILT, thereby keeping the signal on the input and output lines in synchronization.

Figure 3:
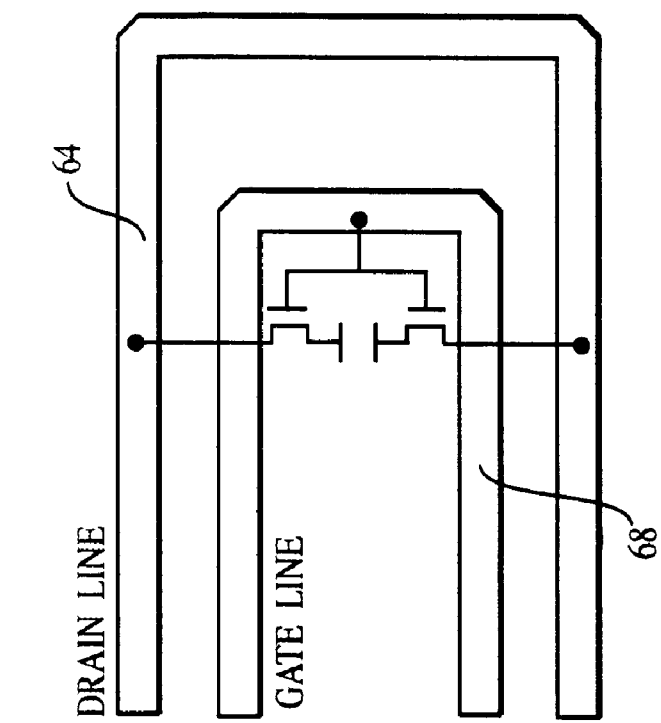
FIG. 3 illustrates the basic circuit design of one output line transmission section ("OLT") shown in FIG. 2 designed with CMOS transistors.
Figure 3:
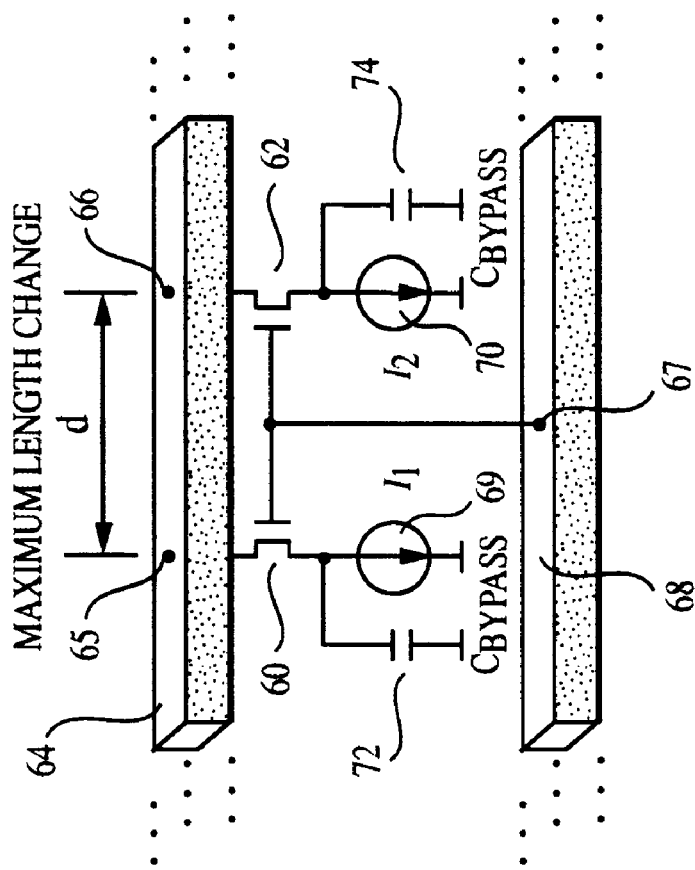

FIG. 3 shows the basic circuitry of an OLT designed with CMOS transistors. The gain section has two identical, integrated CMOS gain transistors, 60 and 62, connected between the output, or drain, line 64 and input, or gate, line 68. Both transistors share the same tap point 67 on the gate line. However, their drains are connected to the drain line at two different tap points 65, 66. The transistors are biased using current sources I1 69 and I2 70, and their sources are ac-grounded using two bypass capacitors 72 and 74, respectively, to maximize their gain. The effective "electrical length" of the drain line is adjusted by varying the ratio of I1 and I2. The difference between the minimum and maximum effective length of the drain line is controlled by the distance, "d," between the drain taps 65 and 66, as is a matter of design choice. In one embodiment (for the design of a 10 GHz CMOS DVCO prototype, discussed below), this distance is 0.3 mm, or 300 microns.

Tuning is accomplished by distributing the current between the two gain transistors 60 and 62 with different current ratios, and thus performing a vector sum of the output signals with different phases. Therefore, the effective total length of the transmission lines lies between the maximum, which is the transmission line's actual length, and occurs when all current is directed through the "upstream" (in the direction of the transmitting signal) transistor 60, and the minimum, which occurs when all current flows through the "downstream" transistor 62, thereby effectively "cutting out" of the transmission line a segment equal to distance, "d." In this way, the oscillation frequency can be tuned continuously from its minimum frequency (maximum length) and it maximum frequency (minimum length). The tuning range is determined by the ratio of "d" (the distance between the drain tap points 65 and 66 of transistors 60 and 62 in each section) to the total length of the transmission lines. Thus, the longer the segment "d" is, the larger the tuning range. It will be appreciated that this distance is a matter of design choice.

The current-steering design shown in FIG. 3 introduces a problem called "delay mismatch." In particular, the voltage on the drain line 64 can lead or lag the gate line 68 voltage in phase depending on the ratio of I1 (69) and I2 (70). This phase mismatch between the gate and drain lines affects the oscillator's phase condition and makes it harder for the oscillator to maintain 360 degrees of phase shift around the loop. In other words, it degrades the synchronization of the gate and drain lines. If not resolved, this phase mismatch can degrade the phase noise at both ends of the tuning range or can even stop the oscillation.

Figure 4:
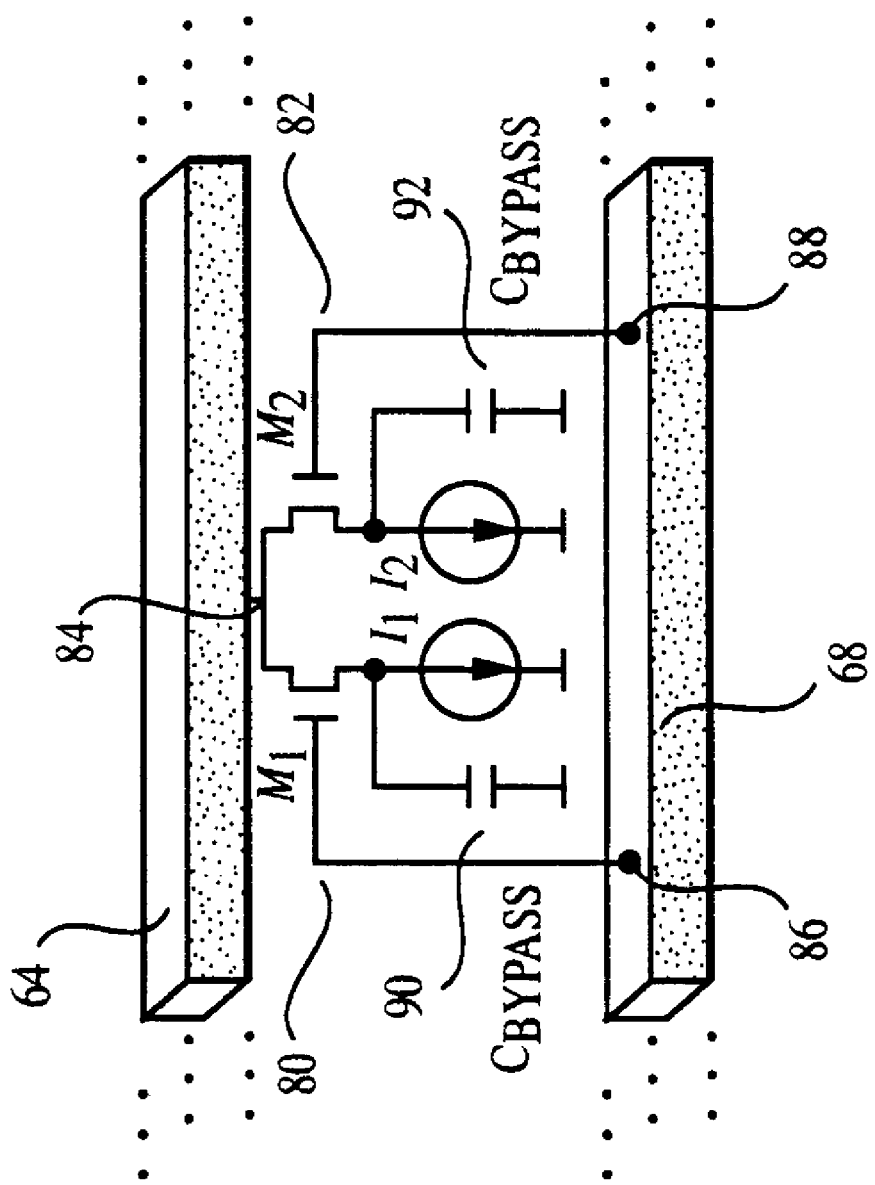
FIG. 4 illustrates the basic CMOS circuit design of one input transmission line section ("ILT") that is complementary to the circuit shown in FIG. 3.

To remedy this problem, the delay mismatch between the gate and drain lines 64, 68 is advantageously minimized by using the complementary ILT configuration shown in FIG. 4. This circuit differs from the OLT circuit in that its gain transistors 80 and 82 share the same drain tap point 84 but their gate taps 86, 88 are separated on the input (gate) line 68 by the same distance as the separation (denoted as "d" in the figure) of the two tap points of the OLT on the output (drain) line of FIG. 3. The ILT's transistors 80, 82 are also biased with current sources I1 and I2, and their sources are ac-grounded using two bypass capacitors 90 and 92, respectively, to maximize their gain. A pair of these complementary sections (FIG. 3 and 4) can be used to cancel the delay mismatch. This delay balancing technique is referred to as "current-steering, delay-balanced tuning."

Special attention should be paid to the layout of these structures as an extra piece of wire can simply act an additional transmission line and introduce excess, unbalanced and unnecessary electrical length. Therefore, in the preferred embodiment, these delay-balanced structures should be physically placed at the "U-turns" of the transmission lines, as shown in FIG. 3 and as discussed in the layout section below.

It will be understood by those of skill in the art that a single OLT or ILT, or a single OLT/ILT pair, or any number of OLT/ILT pairs can be used in accordance with the invention. While a single OLT or ILT can operate as described above, OLT/ILT pairs are preferred. It will further be appreciated by those of skill in the art that the number of OLT/ILT pairs, or sections, used is a matter of design choice.

Figure 5:
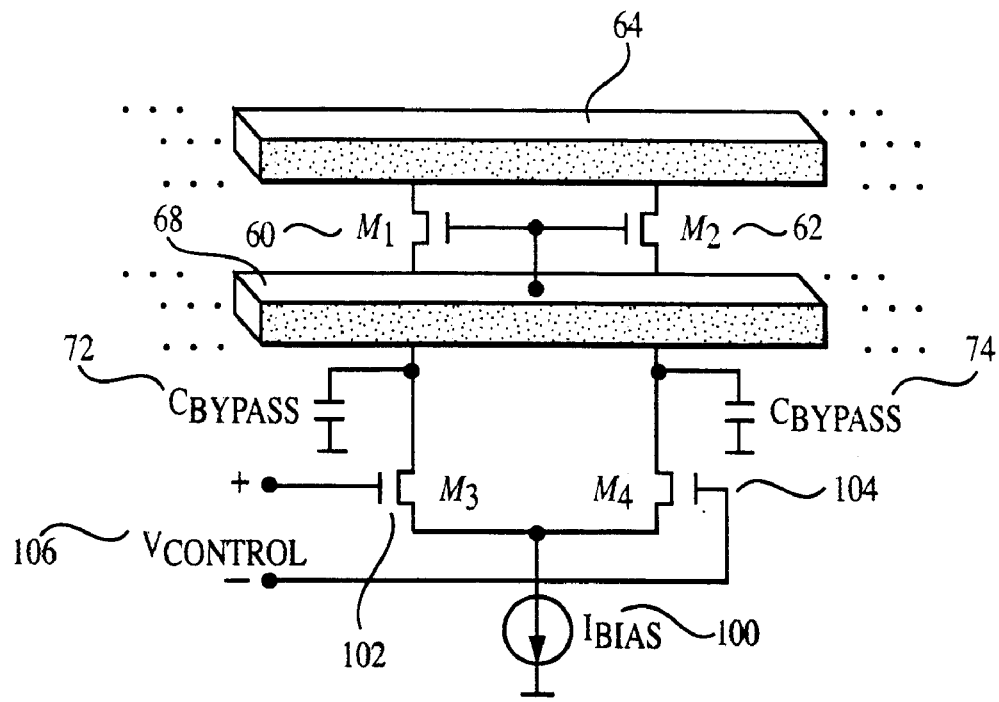
FIG. 5 illustrates the OLT of FIG. 3, with the current-steering circuitry shown in greater detail.
Figure 6:
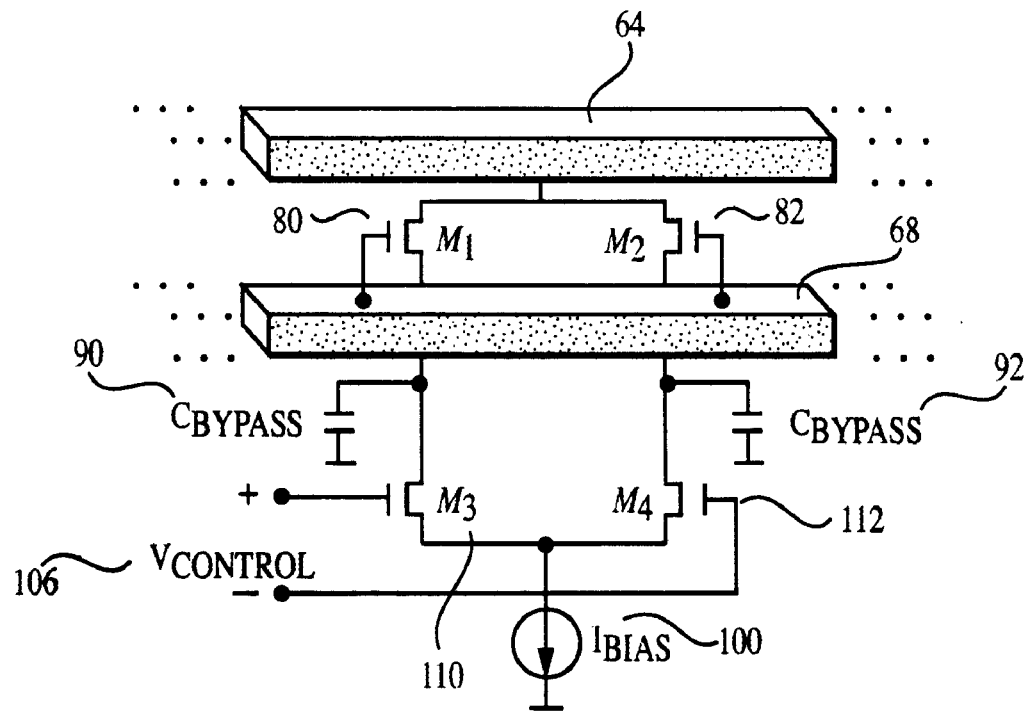
FIG. 6 illustrates the ILT of FIG. 4, with the current-steering circuitry shown in greater detail.

FIGS. 5 and 6 reproduce the OLT and ILT circuits shown in FIGS. 3 and 4, respectively, with the current-steering circuitry shown in greater detail. In each section, I1 and I2 are replaced with the current source $I_{bias}$ 100 and two current steering transistors 102 and 104 (or 110, 112 in FIG. 6). The differential control voltage 106 steers the tail current between the transistors 102 and 104. The channel lengths of transistors 102 and 104 should be chosen longer than the minimum channel lengths to allow for a larger and more uniform range of the differential control voltage, $V_{control}$ 106. Longer channel length also reduces the channel noise of these devices which improves the phase noise of the oscillator.

B. DC Bias Tuning

Figure 7:
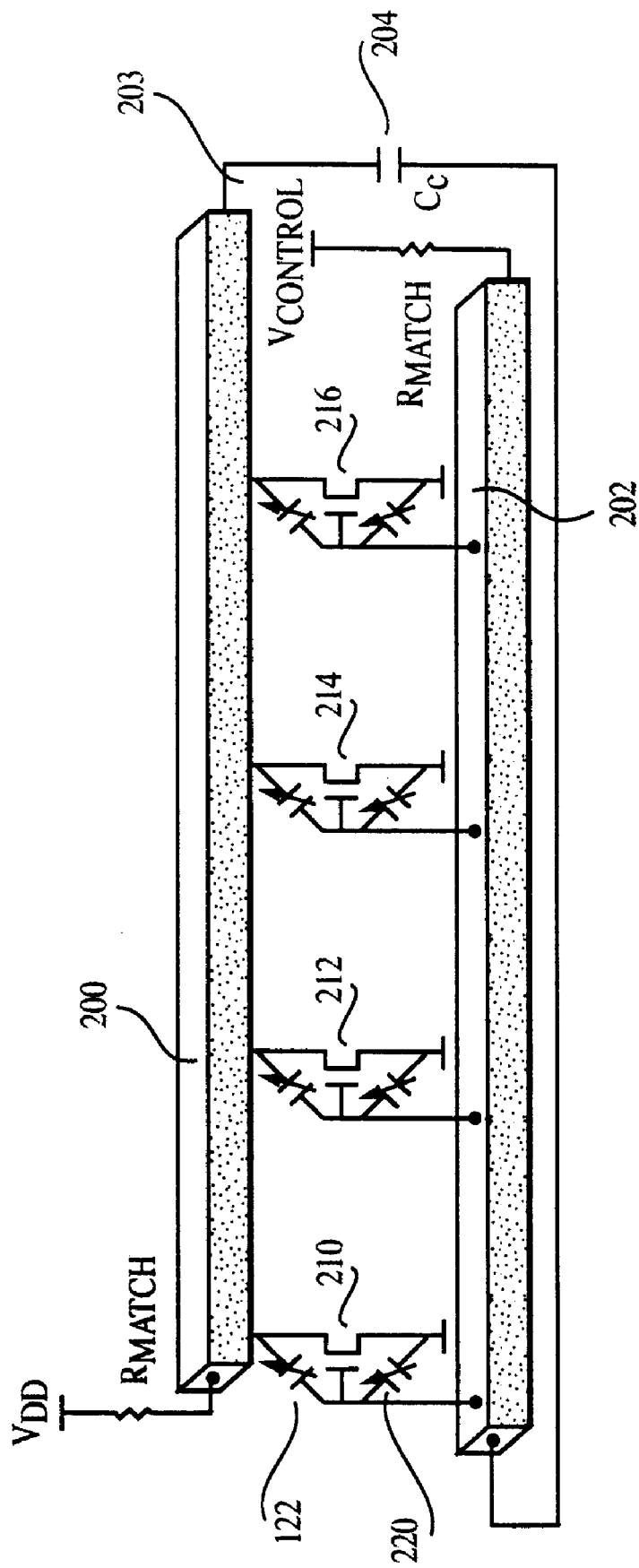
FIG. 7 is a simplified diagram of a tunable DVCO using the capacitive loading tuning technique of the present invention.

An alternative (or complementary) technique for controlling the time delay (and thus tuning the frequency) of the transmission line of the distributed oscillator shown in FIG. 1 is to change the parasitic capacitive loading on the line. Since it is not appropriate to use explicit varactors due to their low Q, it is desirable to use the intrinsic capacitances of the transistors for tuning. Tuning can be achieved by including a coupling capacitor between the input and output transmission lines and then adjusting the dc bias voltage on either the input or output lines. For example, in the case of the CMOS DVCO, as shown in FIG. 7, an ac coupling capacitor, $C_c$, 204 is introduced between the output (drain) and input (gate) lines 200 and 202, respectively, and a dc bias voltage ($V_{control}$) 203 is placed on the input line (or, more specifically, gate line in this example) 202. This modification to the VCO of FIG. 1, permits one to change the nonlinear capacitances of the transistors 210, 212, 214, and 216 (such as $C_{gs}$ 220 and $C_{gd}$ 222) as well as their transconductances, $g_m$, by changing gate bias voltage. More particularly, the junction capacitances depend on the reverse bias on the drain (or collector, in the case of bipolar design). Thus, changes in the characteristic impedance and transmission coefficient (gamma) of the transmission line result in changes in the time delay and thus frequency of oscillation. Thus, as $V_{control}$ 203 is increased, the intrinsic capacitances increase and frequency of oscillation decreases. Simulation results indicate that $C_{gd}$ has the largest effect on the tuning range. In the case of the bipolar DVCO design, it has been determined that adjusting the bias voltage on the collector, or output, transmission line achieves the best tuning range. As discussed below, this technique provides for very wide, but coarse, tuning ranges when compared with the current-steering technique described above.

III. Experimental Testing/Prototypes

In a representative test, a 10 GHz center frequency CMOS distributed voltage controlled oscillator (DVCO) prototype was designed in a 0.35 μm BiCMOS process technology using only integrated CMOS transistors and applying both tuning circuits/techniques detailed above, allowing for both coarse and fine tuning of frequency in a frequency synthesizer. In this example, each gain transistor has a gate width of approximately 60 microns, and gate length of approximately 0.35 microns. Further, as stated above, the two tapping points on the output transmission line for each OLT transistor pair (and two tap points on the input line for each complementary ILT) are separated by the distance, "d", which was conservatively designed at approximately 300 microns. Using the "coarse" capacitive loading, dc bias tuning circuit/technique, the oscillator achieved a tuning range of 12% (9.3 GHz to 10.5 GHz) and a phase noise of −114 dBc/Hz at 1 MHz offset from a carrier frequency of 10.2 GHz. The oscillator provided an output power of −7 dBm without any buffering, drawing 14 mA of dc current from a 2.5V power supply. An HP 8563E spectrum analyzer was used to measure the oscillation frequency and the output power. The insertion loss from the probes to the spectrum analyzer is 4.3 dB. Therefore, any measured power on the analyzer was adjusted for this extra loss. The center output frequency of the oscillator is 10.0 GHz and the output power is −4.5 dBm. The measured power spectrum should be adjusted for a 4.3 dB loss in the setup. Deterministic modulation sidebands are observed in the output spectrum. It will be appreciated by those of skill in the art that these sidebands are induced by the radio broadcast signals absorbed by the probe setup, which modulates the DVCO, and hence are not inherent to the DVCO itself.

Figure 8:
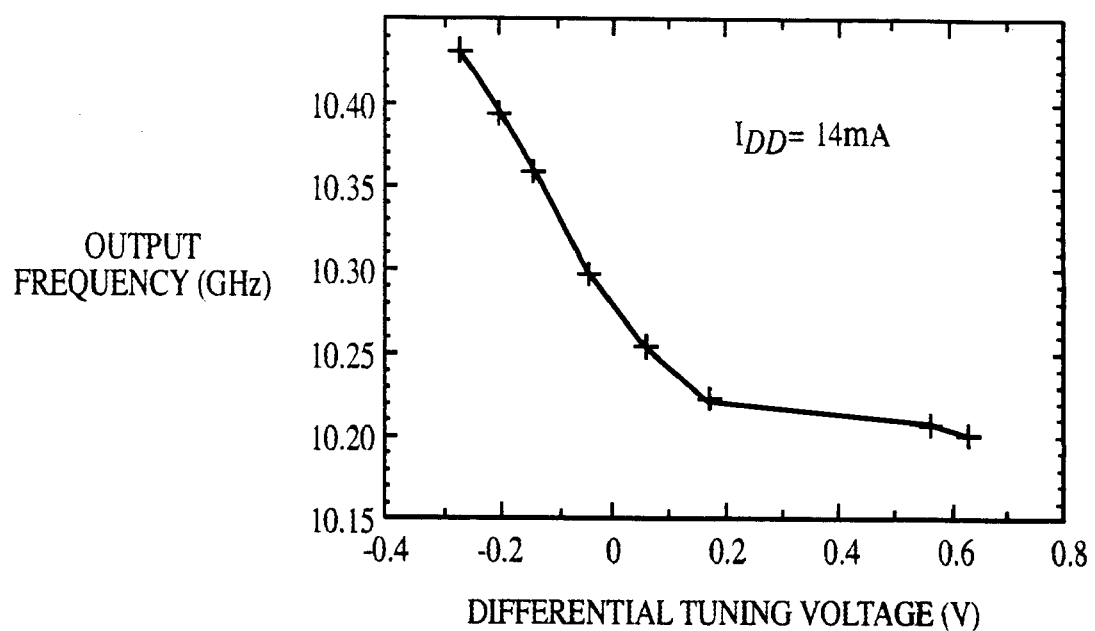
FIG. 8 is a graph showing the tuning range of a prototype CMOS DVCO designed to operate at a carrier frequency of 10.2 GHz, using the current-steering technique shown in FIGS. 2–6.
Figure 9:
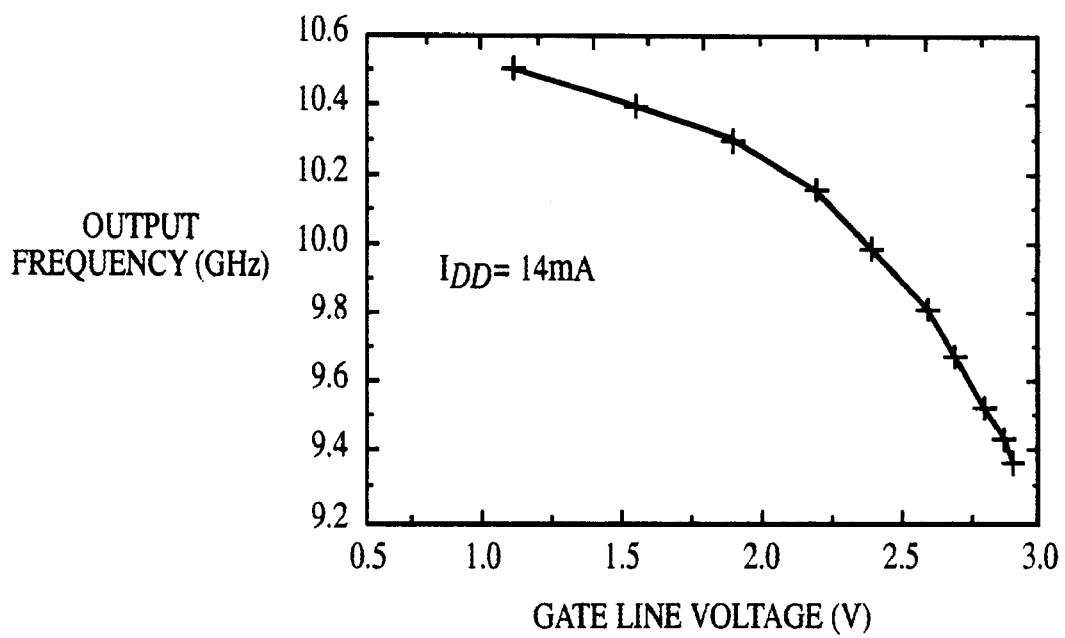
FIG. 9 is a graph showing the tuning range of the DVCO described with reference to FIG. 8, using the capacitive loading technique described in FIG. 7.

FIG. 8 shows that the measured tuning range using the current-steering, delay-balanced tuning technique in this prototype was 2.5% (10.19–10.44 GHz). FIG. 9 shows a tuning range of 12% (9.3–10.5 GHz) with a total drain current of 14 mA using the bias voltage/gate line tuning technique. As stated, in this preferred embodiment, the dual tuning design enables simultaneous coarse and fine tuning in a frequency synthesizer which can improve the capture range.

Additional DVCO prototypes have been designed using the techniques described above. In a representative test, another four-stage CMOS DVCO having a center frequency of 12.5 GHz was designed using only the current-steering technique discussed above. The tuning range was 12.4 GHz to 12.7 GHz. In another test, a free-running, four-stage, current-steering DVCO was designed using double base contact, integrated bipolar transistors, having emitter areas of 0.4×16.8 micron$^2$. This DVCO had a center frequency of 22 GHz with power consumption of 13 mW. This DVCO verified the feasibility of using the tunable DVCO of the invention for LMDS applications. Finally, a 12 GHz bipolar DVCO was designed using the combination current-steering/bias tuning techniques discussed above. Collector (output) line (dc bias) tuning achieved an extremely broad tuning range of 26%, (9.6 GHz–12.45 GHz). The "fine tuning" differential, current-steering, delay-balanced technique achieved a tuning range of 7.4% (from 11.68 GHz to 12.57 GHz). This dual tuning technique is very useful for many applications, including those applications that require improved capture range in a phase-locked loop.

IV. Layout of the DVCO

Figure 10:
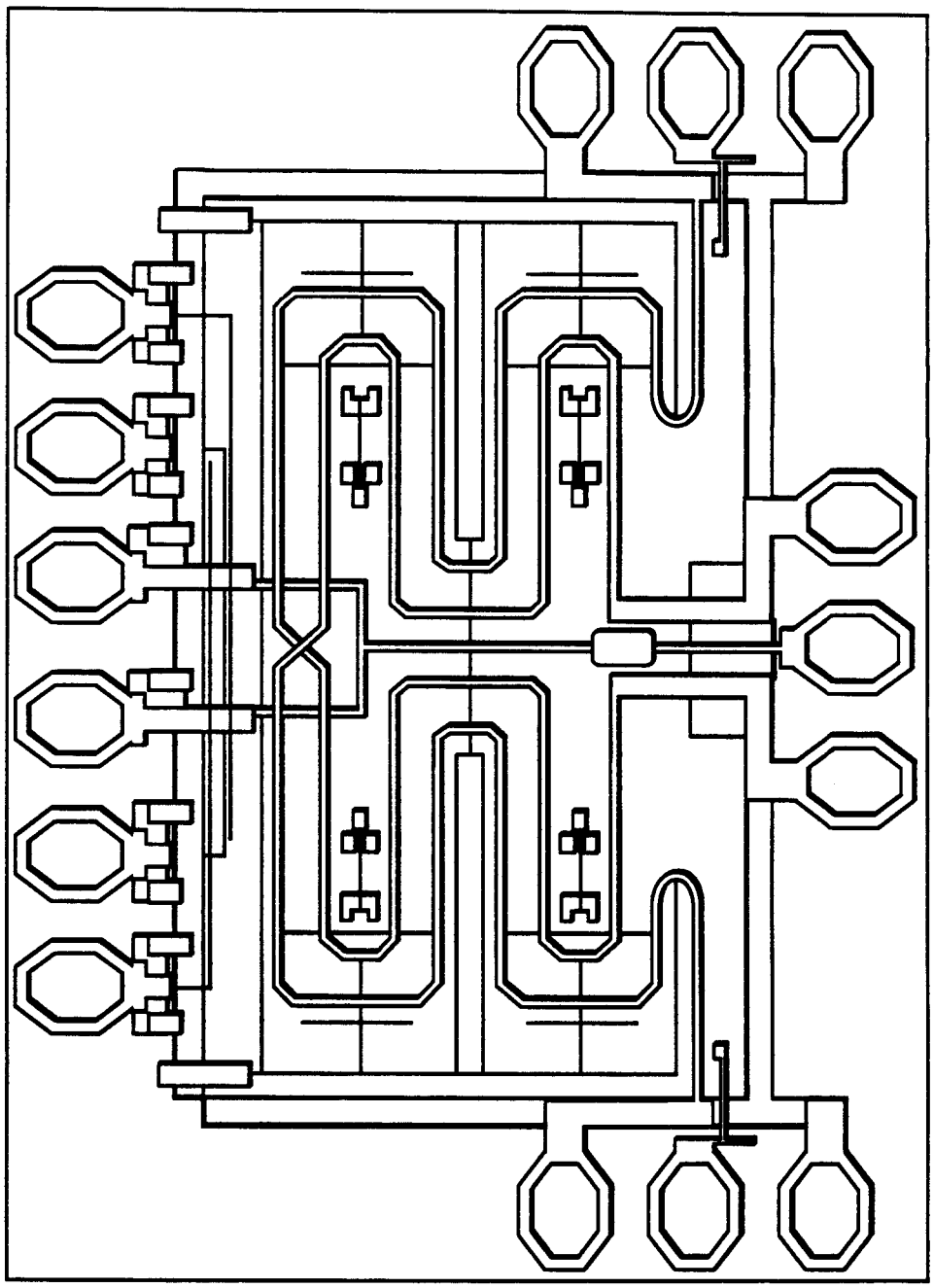
FIG. 10 is a photograph showing the physical layout of the prototype 10 GHz DVCO chip described with reference to FIGS. 8 and 9.

Since the circuits described herein operate at such high (microwave) frequencies, any conductive line can act as a transmission line. Thus, special attention should be directed to the circuit layout. FIG. 10 shows the layout chosen for the 10 GHz CMOS prototype unit designed. As shown, first, the input (gate) and output (drain) lines were made parallel to each other in order to maintain synchronization of signals and their spacing chosen to lower interference. However, due to the feedback path in the oscillator, a crossing where one transmission line goes underneath the other is inevitable. This crossing is implemented using both metal1 and metal2 lines to minimize the loss and compensate for the thickness difference between the top layer and the lower metal layers. Enough vias are introduced at the crossing point to minimize the resistance. Also, there are reverse-biased PN junctions (laminations) underneath the entire transmission line structure to terminate Eddy currents and lower the loss on the transmission lines. In each section, the two gain transistors have identical distances from the tapping points on the transmission lines in order not to introduce unbalanced excess delay as described above. The dc bias lines pass underneath and are perpendicular to the transmission lines to minimize the capacitive loading on the lines. It should be understood that this preferred layout applies to bipolar, or other three terminal active device, designs as well.

Having thus described exemplary embodiments of the invention, it will be apparent that further alterations, modifications, and improvements will also occur to those skilled in the art. Further, it will be apparent that the present system is not limited to use with CMOS or bipolar technology. The techniques described herein are equally applicable to the design of tunable DVCO using other active devices such as vacuum tubes, for example. Such alterations, modifications, and improvements, though not expressly described or mentioned above, are nonetheless intended and implied to be within the spirit and scope of the invention. Accordingly, the foregoing discussion is intended to be illustrative only; the invention is limited and defined only by the various following claims and equivalents thereto.

We claim:

1. An integrated, distributed voltage controlled oscillator (DVCO) that is tunable across a wide frequency range, comprising:
   a first transmission line having an input and an output that is terminated by a first wave-absorbing termination and biased with a dc voltage;
   a second transmission line having an input that is terminated by a second wave-absorbing termination and biased with a dc biasing voltage, and an output that is connected to the input of the first transmission line; and
   circuitry that controllably adjusts the effective electrical length of one or more of the first transmission line and the second transmission line.

2. The DVCO of claim 1, wherein the circuitry introduces a controllable time delay to a signal propagating on the first transmission line and the second transmission line.

3. The DVCO of claim 1, wherein the circuitry a controllable time delay to a signal propagating on the first transmission line and the second transmission line through the use of current steering.

4. The DVCO of claim 1, wherein the circuitry a controllable time delay to a signal propagating on the first transmission line and the second transmission line through the use of dc bias line tuning.

5. An integrated, distributed voltage-controlled oscillator ("DVCO") that is tunable across a wide frequency range.

6. The DVCO of claim 5 further comprising two or more transmission lines, wherein one or more of the transmission lines has a controllable electrical length.

7. The DVCO of claim 5 wherein the DVCO is tuned by controlling a time delay of a signal propagating on a transmission line.

8. The DVCO of claim 5 wherein the DVCO is tuned by controlling a time delay of a signal propagating on a transmission line through the use of current steering.

9. The DVCO of claim 5 wherein the DVCO is tuned by controlling a time delay of a signal propagating on a transmission line through the use of dc bias line tuning.

10. The DVCO of claim 5 further comprising:
    two or more transmission lines; and
    circuitry for controlling an electrical length of one or more of the transmission lines.

11. An integrated, distributed voltage controlled oscillator (DVCO) that is tunable across a wide frequency range, comprising:
    at least one transmission line, each transmission line having an input and an output that is terminated by a corresponding wave-absorbing termination; and
    circuitry that controllably adjusts the effective electrical length of one or more of the transmission lines.

12. The DVCO of claim 11 further comprising a return transmission line having an input that is terminated by a second wave-absorbing termination, and an output that is connected to the input of at least one of the transmission lines.

13. The DVCO of claim 11 wherein each transmission line is further comprises a dc bias voltage.

14. A method of tuning an integrated, distributed voltage-controlled oscillator (DVCO) across a wide frequency range comprising:

providing a signal on one or more transmission lines; and controlling a time delay of the signal so as to control the frequency of the signal.

15. The method of claim 14 wherein controlling the time delay of the signal so as to control the frequency of the DVCO comprises adjusting the effective electrical length of one or more of the transmission lines.

16. The method of claim 14 wherein controlling the time delay of the signal so as to control the frequency of the DVCO comprises adjusting the effective electrical length of one or more of the transmission lines through the use of current steering.

17. The method of claim 14 wherein controlling the time delay of the signal so as to control the frequency of the DVCO comprises adjusting the effective electrical length of one or more of the transmission lines through the use of dc bias line tuning.

18. A method of tuning an integrated, distributed voltage-controlled oscillator (DVCO) across a wide frequency range comprising:

providing a signal on two or more transmission lines; and controlling the effective electrical length of one or more of the transmission lines so as to control the frequency of the signal.

19. The method of claim 18 wherein controlling the effective electrical length of one or more of the transmission lines so as to control the frequency of the signal comprises steering a current associated with the signal from one or more of the transmission lines by selecting one of two or more predetermined taps.

20. The method of claim 18 wherein controlling the effective electrical length of one or more of the transmission lines so as to control the frequency of the signal comprises controlling a dc bias of one or more transmission lines so as to control a nonlinear capacitance of one or more transistors coupled to one or more of the transmission lines.

* * * * *